(12) United States Patent
Boulanger et al.

(10) Patent No.: US 7,321,095 B2
(45) Date of Patent: Jan. 22, 2008

(54) SOLAR GENERATOR PANEL AND A SPACECRAFT INCLUDING IT

(75) Inventors: Bernard Boulanger, Frejus (FR); Silvain Legrand, Nice (FR)

(73) Assignee: Thales, Neuilly sur Seine (FR)

( * ) Notice: Subject to any disclaimer, the term of this patent is extended or adjusted under 35 U.S.C. 154(b) by 809 days.

(21) Appl. No.: 10/681,218

(22) Filed: Oct. 9, 2003

(65) Prior Publication Data
US 2004/0187906 A1    Sep. 30, 2004

(30) Foreign Application Priority Data
Oct. 10, 2002   (FR)   ................................. 02 12574

(51) Int. Cl.
*H01L 31/00* (2006.01)

(52) U.S. Cl. ....................... 136/246; 136/292; 136/245

(58) Field of Classification Search ................ 136/246, 136/245, 292
See application file for complete search history.

(56) References Cited

U.S. PATENT DOCUMENTS

| | | | |
|---|---|---|---|
| 6,017,002 A | 1/2000 | Burke | |
| 6,075,200 A | 6/2000 | O'Neill | |
| 6,118,067 A | 9/2000 | Lashley | |
| 6,177,627 B1 | 1/2001 | Murphy | |
| 6,188,012 B1 | 2/2001 | Ralph | |

FOREIGN PATENT DOCUMENTS

| | | |
|---|---|---|
| EP | 0 976 655 A1 | 2/2000 |
| EP | 1 174 342 A1 | 1/2002 |

*Primary Examiner*—Nam Nguyen
*Assistant Examiner*—Jeffrey Barton
(74) *Attorney, Agent, or Firm*—Sughrue Mion, Pllc.

(57) ABSTRACT

A solar generator panel includes at least one reflector for reflecting solar radiation onto at least one photovoltaic cell. The reflector takes the form of a flexible material blade, a first end of which is fixed to the panel and a second end of which remains free. The material has mechanical properties such that, in a first position, in the absence of vertical pressure, it maintains itself erect so that its free end points to outer space, thereby defining an upper face that faces outer space and an opposite lower face that faces the panel, and, in a second position, in response to vertical pressure, it orients its upper face toward the plane of the panel. One particular application is to high-power solar panels for satellites.

19 Claims, 6 Drawing Sheets

FIG_1

FIG_2a

FIG_2b

FIG_3

FIG_4a

FIG_4b

FIG_5a

FIG_5b

FIG_5c

FIG_6a

FIG_6b

FIG_6c

SOLAR GENERATOR PANEL AND A SPACECRAFT INCLUDING IT

CROSS-REFERENCE TO RELATED APPLICATIONS

This application is based on French Patent Application No. 02 12 574 filed Oct. 10, 2002, the disclosure of which is hereby incorporated by reference thereto in its entirety, and the priority of which is hereby claimed under 35 U.S.C. §119.

BACKGROUND OF THE INVENTION

1. Field of the Invention

The present invention relates generally to solar generator panels, in particular for space applications. It relates more particularly to a solar generator panel, in particular for spacecraft, including at least one reflector for reflecting solar radiation onto at least one photovoltaic cell of the panel.

2. Description of the Prior Art

A solar generator panel transported in a spacecraft such as a satellite generally includes:

a panel supporting an array of photovoltaic cells forming strings of cells, converting solar energy into electrical energy, and
 an array of reflectors that concentrate solar radiation onto the above by means of a coating with adequate properties.

Solar generator panels of the above kind can be distributed in accordance with highly diverse configurations. Conventionally this means a longitudinal succession, parallel to a direction away from the body of the spacecraft, and about which the generator is adapted to turn to track the Sun. However, providing supplementary lateral panels in addition to the panels previously referred to in order to increase the electrical power available has been proposed. Also known in the art are configurations in which the panels are disposed in a transverse direction, i.e. in a direction transverse to the longitudinal direction previously cited in which the spacer arm or yoke that connects the generator to the body of the spacecraft extends and about which the generator is adapted to turn to track the Sun.

The generator is folded up during launch and its panels are stacked in a configuration known as a stacked or stacking configuration.

Putting the generator into operational service, for example when the vehicle is a satellite that has been placed in its service orbit, imposes unfolding the stack of panels: this is referred to as unstacking.

To change from the stacking configuration to the deployed configuration, in which the solar panels are disposed substantially in the same plane, the panels are articulated in pairs, either by means of hinges having adjacent elements articulated about a pivot axis and each fastened to one of the two adjacent panels or by means of hinges connecting parallel edges of the panels.

Figure 1:
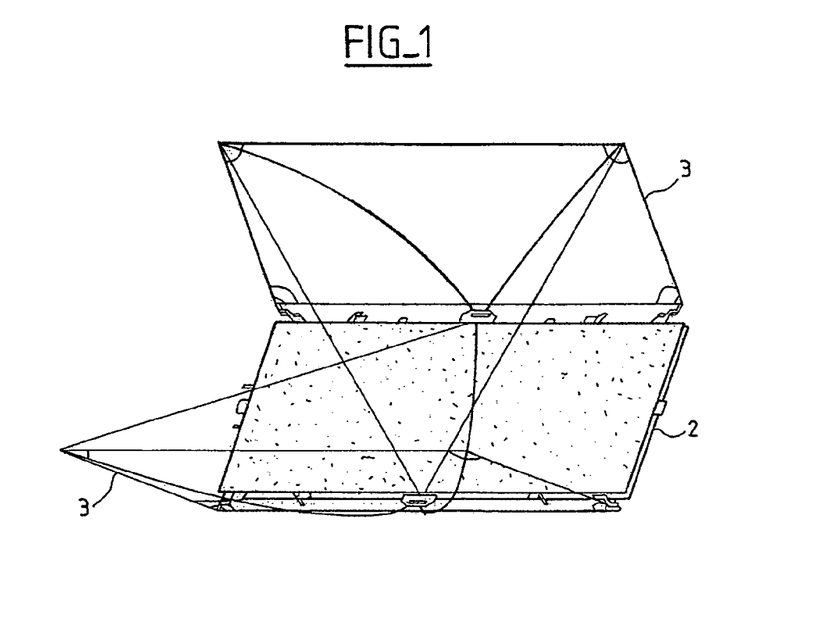
FIG. 1, already described, represents a system of solar panels and associated reflectors conforming to a first prior art concept.

With regard to the method of concentrating solar radiation, a system called the bucket system, like the system 1 shown in FIG. 1, was initially proposed and was attractive because of its apparent simplicity of use. It consists in deploying on respective sides of a conventional solar panel 2 two flexible reflectors that geometrically double the surface area collecting solar flux. However, this system suffers from a number of drawbacks, in particular that of the thermal model adopted and most importantly that of having a technological limitation in terms of concentration factor and therefore of power. Furthermore, it appears difficult to hold the reflective films in an optimum configuration, as there is the risk of defects in terms of flatness or rigidity occurring. A supplementary problem is that the impact of defects (holes, creases) in the reflectors produce a non-uniform active surface, leading to the occurrence of phenomena known as "hot spots": high current variations can surge from one string of cells to another, associated with the nonuniform distribution of the solar flux.

A new concentration concept was then introduced to alleviate the above drawbacks. According to this concept, a generator panel has an alternating succession of strings of cells and reflectors. Thus concentration is effected locally, at the level of the cells, which is why such systems are usually called local concentration systems.

Figure 2A:
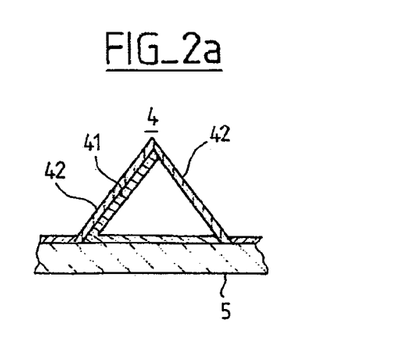
FIGS. 2a and 2b, already described, represent reflectors conforming to a second prior art concept.
Figure 2B:
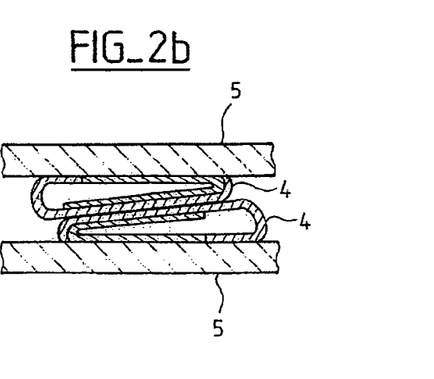

Local concentration systems are described in U.S. Pat. No. 6,177,627, for example, and are shown in FIGS. 2a and 2b of the present application. FIG. 2a shows a triangular section reflector 4 supported by a panel 5. The reflector 4 is formed of a flexible metallic portion 41 covered on two walls that are open toward space by a flexible metallic film 42 able to reflect solar radiation. In the deployed position, as shown in FIG. 2a, the reflector is naturally tensioned, the portion 41 being formed of a material that straightens naturally into an erect position. On the other hand, the facing panels are designed so that when the panels 5 are in their stacked configuration, as shown in FIG. 2b, the space between them is minimized, by compressing the facing reflectors 4 and 4' to the maximum.

In this constrained position, the surfaces of the two reflectors in contact with each other being those of the reflective films, they may be considerably degraded by rubbing contact and thereafter no longer be able to fulfill their reflective function.

Thus an object of the present invention is to remedy the problems stated hereinabove by proposing a solar generator panel including a reflector whose functional reflective surface cannot be degraded in the stacked configuration, for example by rubbing contact.

SUMMARY OF THE INVENTION

To this end, the invention consists in a solar generator panel, in particular for spacecraft, including at least one reflector for reflecting solar radiation onto at least one photovoltaic cell of the panel, and wherein the reflector takes the form of a flexible material blade, a first end of which is fixed to the panel and a second end of which remains free, and the material has mechanical properties such that, in a first position, in the absence of vertical pressure, it maintains itself erect so that its free end points to outer space, thereby defining an upper face that faces outer space and an opposite lower face that faces the panel, and, in a second position, in response to vertical pressure, it orients its upper face toward the plane of the panel. Thus the functional reflective surface of the reflector, which is the upper face, is entirely protected from any degradation by external action, such as rubbing contact with facing surfaces.

Furthermore, another considerable advantage of the invention lies in easy access to the space under the reflective flexible blades of the reflector in the event of needing to repair wiring in that space. Once the solar cells and the reflectors of the panel are installed, the wiring under the "roof" consisting of the reflectors also being in place, a series of tests is carried out to verify the operation of each element of the panel. When using the local concentration reflectors described in U.S. Pat. No. 6,177,627 it is essential to remove the whole of the reflector to obtain access to the associated wiring in the event of a malfunction of one of the cables. Thanks to the invention, it is no longer necessary to remove the reflector. It is sufficient to move away the flexible blade for the required access to be obtained.

In one embodiment, only the upper face is covered with a film optically adapted to reflect solar radiation and optionally covered with a protective coating.

In one embodiment, the mechanical properties of the flexible material are such that in equilibrium in the first position the upper face is concave.

In one embodiment, the panel according to the invention further includes a plurality of reflectors grouped into pairs and whose lower faces face each other in the first position with the reflectors of each pair in contact at least at their free end and at least one of the upper faces of each pair being oriented toward the plane of the panel in their second position.

In one embodiment, the mechanical properties of the flexible material are such that, in equilibrium in the first position, each reflector forms a plane except for its free end which is curved outward to support the coming into contact of the reflectors during the phase of releasing the vertical pressure.

In one embodiment, the surfaces of the lower faces have a low coefficient of friction.

In one embodiment, the upper faces of each pair are folded on themselves in opposite directions in the second position.

In one embodiment, in the second position, a first upper face of a first reflector in each pair is oriented toward the plane of the panel and the second reflector is oriented to face the lower surface of the first reflector.

The invention also provides a spacecraft, such as a satellite, including a solar generator panel according to the invention.

Other features and advantages of the invention will become more clearly apparent on reading the following description with reference to the appended drawings of particular embodiments of the invention.

DETAILED DESCRIPTION OF THE PREFERRED EMBODIMENTS

Items having identical functions carry the same reference numbers in all the figures.

Figure 3:
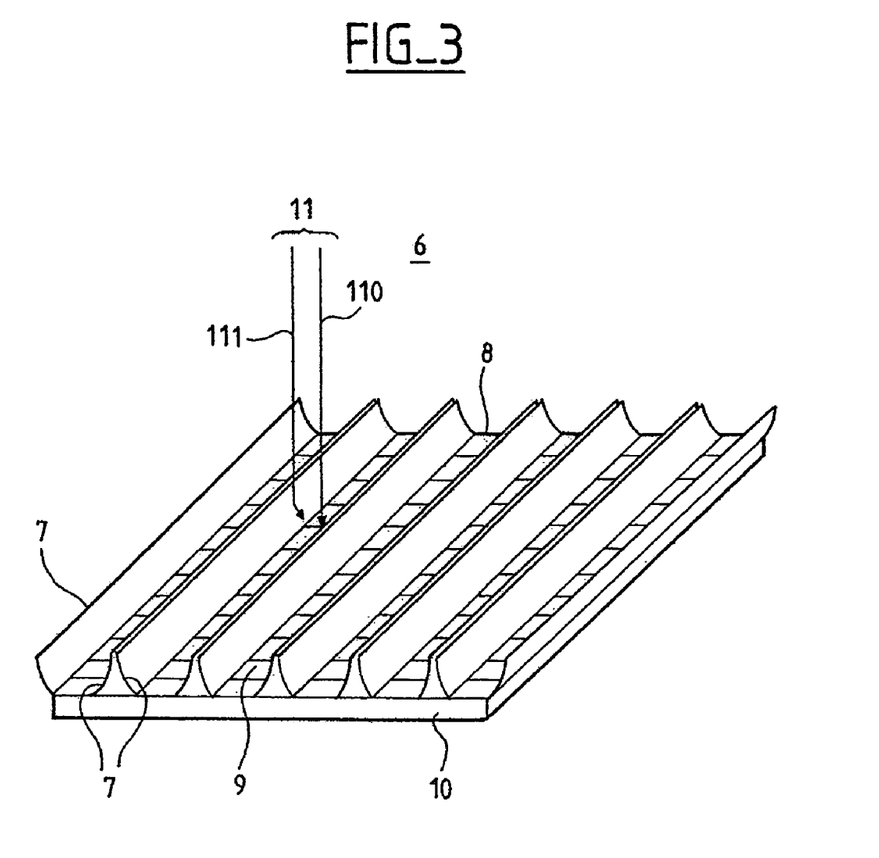
FIG. 3 is a diagrammatic perspective view of one embodiment of a solar generator panel according to the invention.

FIG. 3 is a diagrammatic perspective view of a solar generator panel 6 conforming to one embodiment of the invention.

The panel 5 has an alternating succession of reflectors 7 and strings 8 of photovoltaic cells 9 on its face intended to be oriented toward the light source. Note that, in this embodiment of the reflectors, the latter have a slightly concave configuration. Other reflector shapes can be envisaged, as explained hereinafter. The reflectors and the cells are supported by a support panel 10.

In FIG. 3, arrows represent a solar flux 11, some beams 110 of which illuminate the cell 9 directly while other beams 111 impinge on the cell after reflection at a reflector 7.

Note that in FIG. 3 the cells and reflectors are arranged along the length of the panel (i.e. parallel to a direction away from the body of the satellite), so that they are not affected by seasonal variations in the angle of incidence of the solar flux.

Figure 4A:
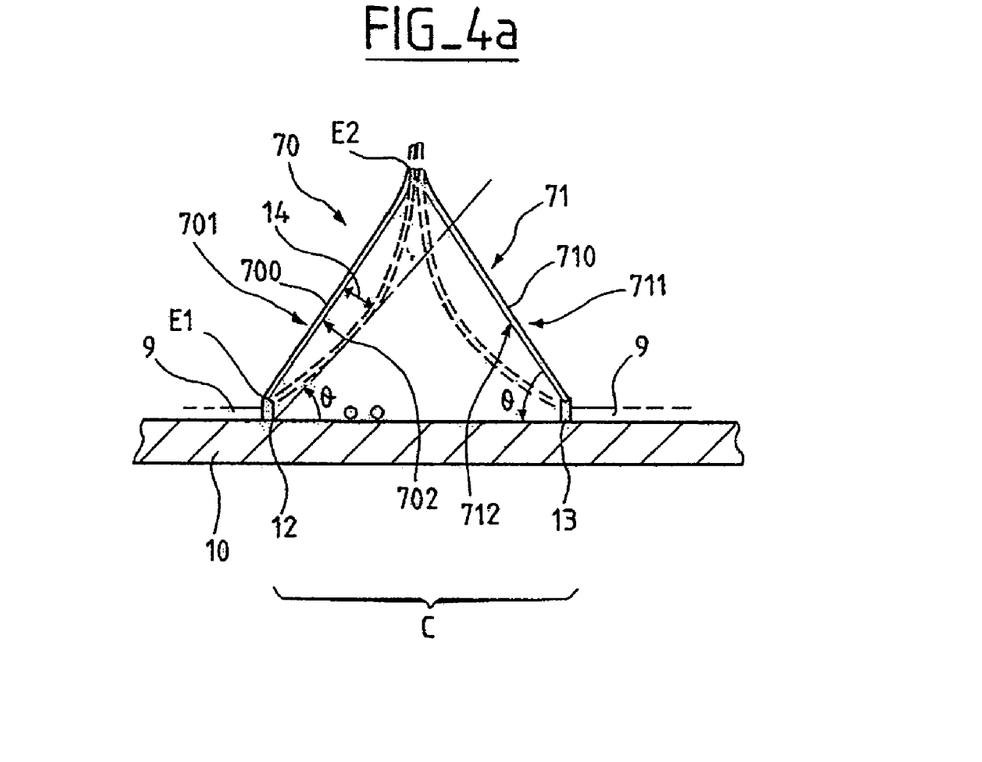
FIG. 4a is a view in cross section of the FIG. 3 panel in an unstacked configuration, concentrating on a pair of facing reflectors.
Figure 4B:
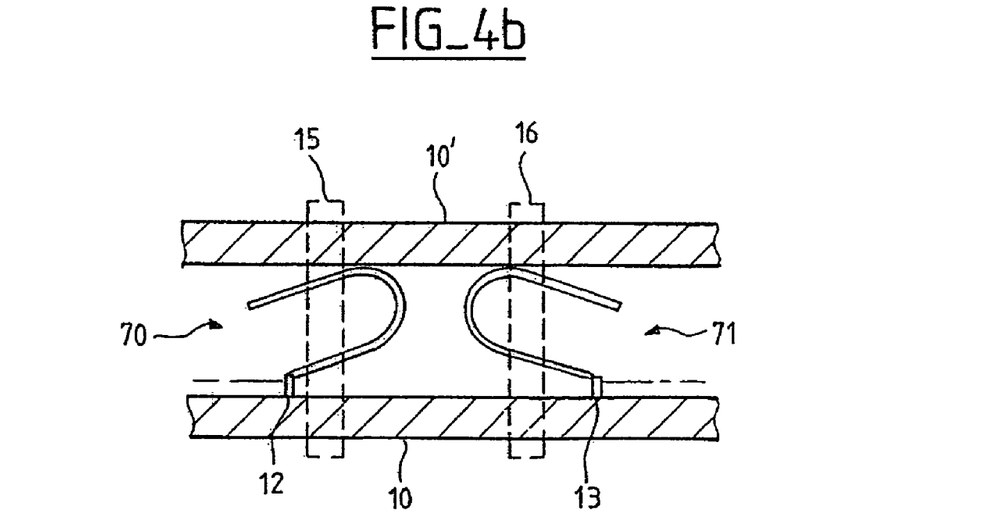
FIG. 4b shows the same section in a stacked configuration.

FIG. 4a is a cross section of the FIG. 3 panel in an unstacked configuration, concentrating on a pair C of reflectors 70, 71, and FIG. 4b shows the same section in a stacked configuration.

Each reflector 70, 71 consists of a flexible blade comprising a flexible metallic material, for example titanium. Of course, any other material having the same flexible and erectile characteristics (i.e. tending to straighten in the absence of any contrary pressure) can be envisaged. On the upper faces of the blades 70, 71 the titanium is covered with an optically reflective film 700, 710 of silver deposited by the VDA (Vacuum Deposit Ag) process and in turn covered with a protective coating (not shown). This feature of the blade enables it to reflect incident solar rays toward the facing cell 9.

After releasing the panels, and starting from a stacked configuration described hereinafter, the reflectors straighten naturally into their unconstrained position in the unstacked configuration of the panels shown in FIG. 4a. As shown here, the two reflectors face each other and are associated with respective strings of adjacent cells. Each blade 70, 71 is fixed at one of its ends E1, E2 to the panel 10 by fixing means 12, 13 known in the art and their opposite free ends are naturally in contact, exerting the same pressure against each other in an equilibrium position.

Note that the end E2 can be slightly curved in the outward direction to withstand the coming into contact of the two blades 70, 71 during the phase of releasing the vertical pressure.

In an advantageous variant of the invention, shown in dashed line in FIG. 4a, the flexible material used for the blade has mechanical properties such that in the equilibrium position, in which the facing blades rest against each other, their upper faces 701, 711 each have some concavity. The benefit of this is explained hereinafter.

As mentioned above, it is already appropriate to emphasize the advantage obtained from the local concentration configuration, which lies in the reduction of the effect of distortion of the reflectors on the power supplied by the solar panel. This is reflected in an improved concentration factor.

In the case of the present invention, the concentration factor $C_{geometric}$ is a function of the angle θ of inclination of the reflectors to the plane of the support panel, in accordance with the following equation:

$$C_{geometric}=1+2\sin(2\theta-90°)$$

The theoretical limit of this factor is $C_{geometric}=3$.

Figure 5A:
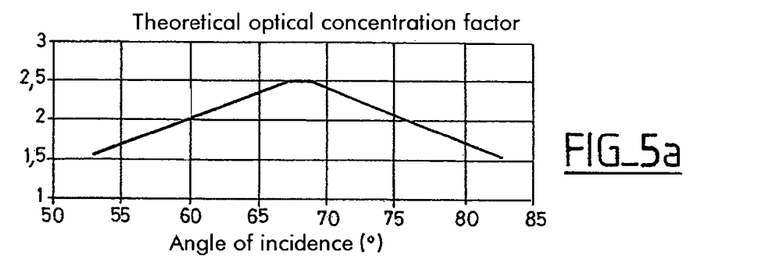
FIG. 5a represents the evolution of concentration factor as a function of the angle of incidence for a given configuration.
Figure 5B:
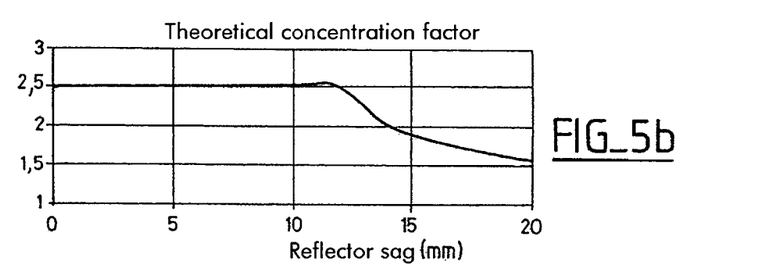
FIG. 5b shows the impact of the concavity of the reflectors on the optical concentration factor $C_{optic}$.

In the practical situation in which the reflectors have a length 2L, where L is the dimension of the cell 9, as shown in FIG. 4a, the theoretical optical factor obtained by the ray tracing method reaches an optimum value of 2.5 for an angle of incidence corresponding to θ=68°, as can be seen in FIG. 5a, which shows the theoretical optical concentration factor as a function of the angle θ of incidence. This presupposes that the reflectivity of the reflectors is R=1 and that the reflectors are perfectly flat. FIG. 5b shows the effect of the presence of a curvature or concavity of a wall of the reflector, indicated by a double-ended arrow 14 (FIG. 4a). The reflector sag (i.e. the length of this arrow) corresponds to the distance between the plane position of the reflector and the point of the curvature farthest from the plane of the reflector. A sag of more than 10 mm contributes to a sudden decrease in the optical concentration factor.

Figure 5C:
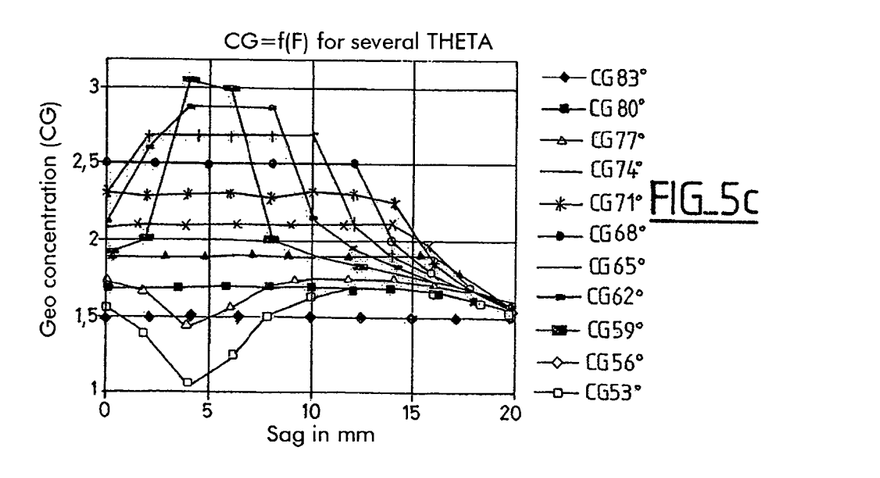
FIG. 5c shows the conjoint effect of the concavity and the angle of incidence of the reflectors on the optical concentration factor $C_{optic}$.

Any concavity of the reflectors leads to a variation in the angles of incidence of the reflectors. FIG. 5c shows the variation of the concentration factor for different sags and consequently different angles of incidence in the practical initial case of $C_{optic}=2.5$. It can be seen that the optimum is for a sag of around 4 mm ($C_{optic}>3$ and greater than the initial concentrator factor 2.5). In fact, if the angle of inclination of the reflectors decreases, the surface area of the reflectors seen by the Sun increases and the potential energy received increases. In the case of plane reflectors, this energy is not reflected toward the cell, but if they have a curvature, this energy can be reflected onto the cell and thereby increase the concentration factor.

Figure 5D:
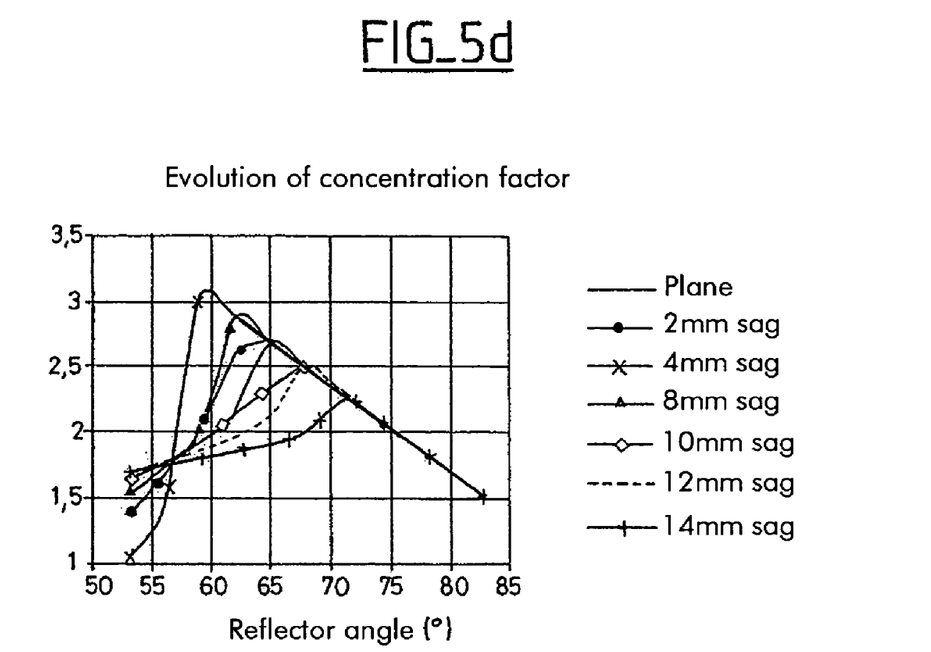
FIG. 5d shows the sensitivity of the optical concentration factor $C_{optic}$ as a function of the angle of incidence which is itself linked to the concavity.

For a 4 mm sag, $C_{optic}$ can become greater than the initial $C_{optic}$, but then becomes very sensitive to the angle θ of incidence, as shown in FIG. 5d.

The optical concentration factor depends on the optical efficiency R of the material of the reflective film: $C_{optic}=1+R(C_{optic\ R=1}-1)$. For example, for R=1, $C_{optic}=2.5$ and for R=0.88, $C_{optic}=2.32$.

Typically, to obtain an optical concentration factor that is stable to within 10%, an angle of incidence stability of ±4° and a sag of less than 12 mm are required.

It must be emphasized, as much for the embodiment shown in FIG. 4a as for the variant shown in dashed outline, that the lower surfaces 702, 712 can have a coefficient of friction Φ such that tan Φ<0.25 in the case of titanium, for example. With this kind of arrangement, when the panels are released, if the two blades are in an asymmetrical position, the nonrubbing plane portions of the lower surfaces will automatically begin to move to adjust the positions of the blades toward an equilibrium position in which symmetry is achieved.

FIG. 4b shows the same section as FIG. 4a in the stacked configuration of the panels 10, 10'.

The novelty of the invention finds its full expression in the position that the blades adopt in the stacked configuration of the panels. On the ground, the upper surfaces 701, 711 of the blades are folded on themselves in opposite directions by the pressure of the upper panel 10'. The panels 10, 10' are held against each other by means of clamping bands 15, 16.

Held in this way on the ground until they are released, the upper surfaces 701, 710 of the blades are never in contact with the upper panel 10' or any other element of the panel. This position prevents the reflective film from being degraded by rubbing contact.

The bands are intended to be released on the ground after the panels have been folded. The release means are not described in the present application because they are known in the art. It often happens that the sequences of deploying and refolding the wing occur several times, in particular if several tests are necessary. It is clear that this increases the risk of the reflective surfaces in contact being degraded, and it is therefore clear that the invention that is the subject matter of the present application provides a radical solution to this problem compared to the prior art.

Figure 6A:
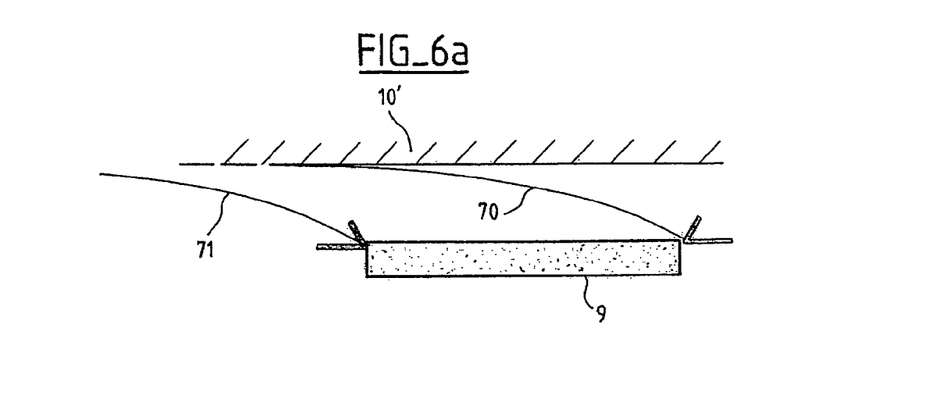
FIG. 6a represents a pair of reflectors in the stacked position of the panel in another embodiment of the invention.
Figure 6B:
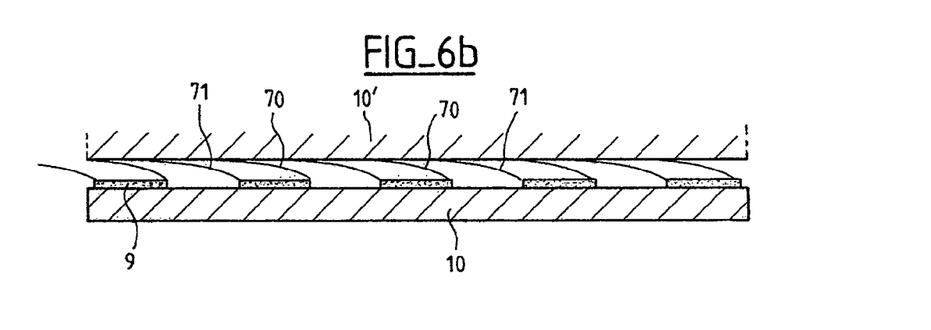
FIG. 6b represents the same configuration for a plurality of pairs of reflectors embracing a plurality of strings of cells.
Figure 6C:
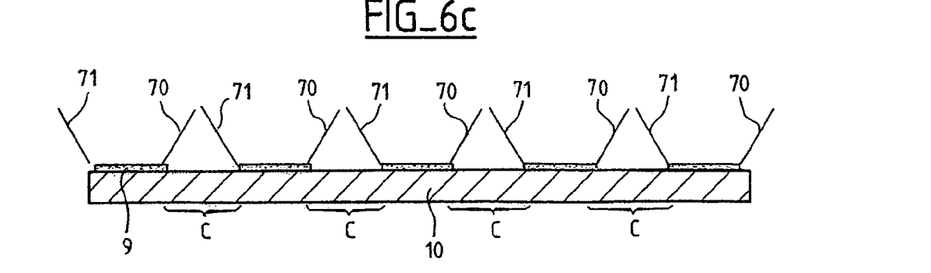
FIG. 6c shows the FIG. 6b panel in the unstacked configuration of the panels.

FIG. 6a shows a pair of reflectors of another embodiment of the invention in the stacked position of the panels, FIG. 6b shows the same configuration with several pairs of reflectors and several strings of cells, and FIG. 6c shows the FIG. 6b panel in the unstacked configuration of the panels. In this embodiment, in the unstacked configuration, as shown in FIGS. 6a and 6b, only the upper surfaces of the blades 71 (those shown at the left-hand end of the cells 9) are folded on themselves, thereby protecting the reflective film of their wall from rubbing against the wall of the panel 10'. In contrast, the blades 70 have their upper surfaces against the wall of the panel 10' in the stacked configuration.

The film 700 of aluminum or silver or some other deposited material that is optically highly reflective in the visible spectrum and electrically conductive is absorbent in the range of infrared frequencies to absorb in the form of infrared radiation stored heat generated by the solar radiation and is optically reflective in the range of frequencies of visible light. The lower surface 702, 712 is adapted to evacuate heat into the vacuum of space by emission, and can be a deposit of black paint. These two surface treatments are applied to the flexible metallic support material. In this embodiment, a deposit of aluminum on the external wall of the reflector provides an infrared emissivity of 0.3. The lower surface of the reflector is covered with black paint with high emissivity in the infrared. This is advisable because in space, because of the very low gravity, there can be no convection and the temperature of the solar generator panel is controlled entirely by heat exchanges with the environment by conduction and radiation.

The invention clearly reduces the risk of electrostatic discharge by using reflectors 70, 71 covered with a film 700, 710 that is not only optically reflective but also, and most importantly, electrically conductive.

Aluminum being electrically conductive, and the reflectors being placed on the illuminated face of the solar panel, photo-emission reduces the quantity of charge stored in the structure (electrical mass of the satellite). The potential of the structure is therefore less negative. The risk of primary electrostatic discharge is reduced. To this end, it is essential for the coating of the reflectors to be conductive and to be electrically connected to the ground of the satellite (conductive portions of the structure).

The advantage of the invention lies equally in the fact that the plasma generated by the primary electrostatic discharge phenomenon, which is known to the person skilled in the art, cannot propagate between adjacent cells, the reflectors serving as screens. Moreover, this concept increases the distance between the emission site and the adjacent solar cell in the event of a secondary discharge. The distance between solar cells (which is of the order of 0.8 mm) is reduced to the distance between the reflector (the emission site in this case) and the adjacent cell; this distance can be a few millimeters. The threshold voltage between cells above which a secondary arc appears is increased, which reduces the risk of secondary arcing. In fact, the use for these reflectors of an electrically conductive coating electrically connected to the electrical ground of the panel reduces the risk of primary electrostatic discharge and the risk of secondary arcing.

Of course, the invention is not limited to the embodiments described in the present application.

The invention claimed is:

1. A solar generator panel, comprising at least one reflector for reflecting solar radiation onto at least one photovoltaic cell disposed on a support panel, and wherein said reflector takes the form of a flexible material blade, a first end of which is fixed to said support panel and a second end of which remains free, and said material has mechanical properties such that, in a first position, in the absence of vertical pressure, it maintains itself erect so that its free end points to outer space, thereby defining an upper face that faces outer space and an opposite lower face that faces said support panel, and, in a second position, in response to vertical pressure, it orients its upper face toward the plane of said support panel.

2. The panel claimed in claim 1 wherein only said upper face is covered with a film optically adapted to reflect solar radiation and optionally covered with a protective coating.

3. The panel claimed in claim 2, wherein said film is electrically conductive.

4. The panel claimed in claim 1 wherein the mechanical properties of said flexible material are such that in equilibrium in said first position said upper face is concave.

5. The panel claimed in claim 1, further including a plurality of reflectors grouped into pairs and whose lower faces face each other in said first position with the reflectors of each pair in contact at least at their free end and at least one of the upper faces of each pair being oriented toward the plane of the support panel in their second position.

6. The panel claimed in claim 5 wherein the mechanical properties of said flexible material are such that, in equilibrium in said first position, each reflector forms a plane except for its free end which is curved outward to support the coming into contact of said reflectors during the phase of releasing said vertical pressure.

7. The panel claimed in claim 5 wherein the surfaces of said lower faces have a low coefficient of friction.

8. The panel claimed in claim 5 wherein said upper faces of each pair are folded on themselves in opposite directions in said second position.

9. The panel claimed in claim 5 wherein, in said second position, a first upper face of a first reflector in each pair is oriented toward the plane of said support panel and the second reflector is oriented to face said lower surface of said first reflector.

10. A spacecraft including a solar generator panel as claimed in claim 1.

11. The spacecraft of claim 10, wherein the spacecraft is a satellite.

12. The panel claimed in claim 1, wherein the upper face reflects solar radiation onto said at least one photovoltaic cell of said support panel.

13. The panel claimed in claim 1, wherein the lower face is adapted for heat dissipation.

14. A solar generator panel, comprising:
a support panel;
a photovoltaic cell disposed on the support panel;
a reflector to reflect solar radiation onto the photovoltaic cell, wherein the reflector comprises a first end fixed to the support panel, a second end that is free, an upper face and a lower face; and
wherein in a first position, in the absence of a vertical force applied to the reflector in a direction generally towards the support panel, the upper face faces away from the support panel and the lower face faces towards the support panel, and in a second position, in the presence of the vertical force applied to the reflector in the direction generally towards the support panel, at least a portion of the upper face faces the support panel.

15. The solar generator panel according to claim 14, wherein the upper face comprises a reflective surface that reflects solar radiation.

16. The solar generator panel according to claim 14, wherein the reflector is flexible so as to flex from the first position to the second position in response to the vertical force.

17. A solar generator panel, comprising:
a support panel;
at least three rows of photovoltaic cells disposed in parallel on the support panel;
at least three rows of reflectors disposed in parallel, alternating with the rows of photovoltaic cells, wherein each of the reflectors comprises a first end fixed to the support panel, a second end that is free, an upper face and a lower face; and wherein in a first position, in the absence of a vertical force applied to the reflector in a direction generally towards the support panel, the upper face faces away from the support panel and the lower face faces towards the support panel, and in a second position, in the presence of the vertical force applied to the reflector in the direction generally towards the support panel, at least a portion of the upper face faces the support panel.

18. The solar generator panel according to claim 17, wherein each reflector is flexible so as to flex in response to the vertical force to move from the first position to the second position.

19. The solar generator panel according to claim 17, wherein each said row of said reflectors further comprises reflectors arranged as reflector pairs, wherein a first reflector of the reflector pair is oriented opposite to a second reflector of the reflector pair.

* * * * *